United States Patent [19]

Cahill et al.

[11] Patent Number: 5,726,589
[45] Date of Patent: Mar. 10, 1998

[54] OFF-CHIP DRIVER CIRCUIT WITH REDUCED HOT-ELECTRON DEGRADATION

[75] Inventors: Joseph J. Cahill; Robert R. Williams, both of Rochester, Minn.

[73] Assignee: International Business Machines Corporation, Armonk, N.Y.

[21] Appl. No.: 551,663

[22] Filed: Nov. 1, 1995

[51] Int. Cl.⁶ .................. H03K 19/0185; H03K 19/0948
[52] U.S. Cl. .................... 326/81; 326/86; 326/87
[58] Field of Search .................. 326/83, 86–87, 326/80–81, 57–58, 27, 121, 34

[56] References Cited

U.S. PATENT DOCUMENTS

| | | |
|---|---|---|
| 4,421,994 | 12/1983 | Puri et al. . |
| 4,638,187 | 1/1987 | Boler et al. . |
| 4,704,547 | 11/1987 | Kirsch . |
| 4,918,339 | 4/1990 | Shigeo et al. . |
| 4,961,010 | 10/1990 | Davis ........................ 326/87 |
| 5,034,637 | 7/1991 | Jungert . |
| 5,089,722 | 2/1992 | Amedeo . |
| 5,220,209 | 6/1993 | Seymour ........................ 326/87 |
| 5,381,059 | 1/1995 | Douglas ........................ 326/58 |
| 5,391,939 | 2/1995 | Nonaka . |
| 5,438,278 | 8/1995 | Wong et al. ........................ 326/83 |
| 5,493,233 | 2/1996 | Shigehara et al. ........................ 326/121 |

*Primary Examiner*—Jon Santamauro
*Attorney, Agent, or Firm*—Felsman, Bradley, Gunter and Dillon

[57] ABSTRACT

An output driver circuit for a semiconductor chip has a push-pull output with a P-channel pull-up and an N-channel pull-down. Predrivers produce push-pull outputs for driving the gates of the output driver. In previous circuits, a stacked arrangement was usually employed where the N-channel pull-down transistor had another N-channel transistor, with gate connected to the voltage supply, in series with it. In this invention, a parallel N-channel or P-channel transistor is employed to shunt part of the current at the beginning of a transition from high-to-low at the output node of the off-chip driver circuit, and thus lower the voltage across the pull-down transistor to a level which will avoid hot-electron degradation. This parallel transistor is small compared to the main N-channel pull-down, and serves to reduce the output node voltage to a level which does not present a likelihood of hot-electron effects in the main pull-down device. Thus, large current flow through the N-channel pull-down is delayed until the voltage is reduced to an acceptable level. At the same time, this delay is not such as would unduly compromise the high speed nature of the circuits.

6 Claims, 6 Drawing Sheets

OFF-CHIP DRIVER CIRCUIT WITH REDUCED HOT-ELECTRON DEGRADATION

BACKGROUND OF THE INVENTION

1. Technical Field

This invention relates to driver circuits for integrated circuit chips, and more particularly to reduction in hot-electron degradation in CMOS driver circuits for producing outputs from an integrated circuit device to off-chip environments where overvoltages may occur.

2. Description of the Related Art

CMOS integrated circuits, as typically used as the microprocessors, memory, and logic circuitry for computers, are being designed with ever-decreasing sizes for the MOS field-effect transistor devices, and with ever-decreasing operating voltages. The reduction in size is advantageous in that component density is increased, power consumption can be decreased, and performance (speed) can be increased. However, smaller size causes an increased likelihood of degradation due to the so-called "hot-electron" effect, which is of course offset by the reduction in operating (supply) voltage, which is itself advantageous because power levels are lowered and speeds are increased. But the reduction in operating voltage increases the likelihood that the devices will be exposed to over-voltages which are a source of this hot-electron degradation; this is because the newer devices with lowered supply voltage will most likely be installed in system boards having other I/C's with higher supply voltages.

When interfacing two chips which have different voltage supplies, the differences in operating and supply voltages must be taken into account. There are two kinds of over-voltage which are involved here. There is the conventional overvoltage situation where pad voltage is above the buffer circuit supply voltage, and this causes large currents from the pad into the chip supply through the P-channel MOS transistor drain-to-N-Well diode that gets forward biased. This type of overvoltage problem is remedied by methods such as disclosed in U.S. Pat. No. 5,151,619, discussed below. The other type, of concern here, is hot electron degradation, where voltage thresholds for damage to a transistor are smaller than the buffer supply voltages and smaller than the bus signal voltages. Various ways of arranging these interfaces between two chips having different voltage supplies have been used.

For example, a chip using 5V technology interfaced with a chip using 3.6V technology may have buffers in the 5V chip that drive between 5V and ground, but receive a 3.6V signal; here the uplevels and thresholds are set as if $V_{dd}$ were 3.6V. In the 3.6V chip, buffers have protection against conventional overvoltage; these buffers receive 5V signals and drive 3.6V signals.

Another situation is where a 2.5V chip is interfaced to a chip using 1.8V technology. The 2.5V chip has buffers which operate with signals of 2.5V-to-ground, both driving and receiving. The 1.8V chip has two voltage supplies, a 2.5V supply for the buffers and a 1.8V supply from everything else; the buffers drive and receive 2.5V signals, and must protect transistors with hot-electron limits below 2.5V from signal voltages at or slightly above 2.5V. And, the buffer circuits must interface with 1.8V signals on the rest of the chip. The same sort of arrangement would be used for interfacing between 3.6V and 2.5V chips.

The hot electron effect is related to the fact that, in an MOS device, as the channel length decreases the electric field increases, for a given operating voltage. A higher electric field may cause carriers in the channel to gain sufficient energy to induce avalanching. When avalanching occurs, additional carriers are generated, and some of these carriers may become trapped in the gate oxide overlying the channel. These trapped charges may have deleterious effects on subsequent device operation, e.g., reduction in gain or change in threshold voltage. These deleterious effects increase with time, resulting in a greatly reduced lifetime of the integrated circuits, i.e., failures that appear some time after the devices are put into use, but long before an expected lifetime for the system.

Of course, process improvements have been made which reduce the effect of high electric field at the drain-to-channel junction. Of note is the reduction of doping concentration at the drain in the vicinity of the channel, using the so-called lightly-doped drain or LDD technique. Nevertheless, as device density is increased and operating voltage is decreased, there is a continuing expectation that circuit improvements are needed to counter the possible hot-electron degradation.

SUMMARY OF THE INVENTION

It is therefore one object of the present invention to provide an improved output driver for integrated circuit technology.

It is another object of the present invention to provide an improved method of preventing hot electron effects from degrading the performance of devices in an output circuit when a semiconductor device is connected to an external bus which produces overvoltage.

It is a further object of the present invention to provide an improved method of reducing degradation of CMOS devices in output drivers due to hot electron effects, without adding devices to the circuit which increase the size unduly.

The above as well as additional objects, features, and advantages of the present invention will become apparent in the following detailed written description.

According to one embodiment of the invention, a typical off-chip driver circuit for a semiconductor chip has a push-pull output with a P-channel pull-up and an N-channel pull-down. Predrivers produce push-pull outputs for driving the gates of these output transistors. In previous circuits, a stacked arrangement was usually employed where the N-channel pull-down transistor had another N-channel transistor, with gate connected to the voltage supply, in series with it. In contrast, according to this invention, a parallel N-channel or P-channel transistor is employed to shunt part of the current at the beginning of a transition from high-to-low at the output node of the off-chip driver circuit. This parallel transistor is small compared to the main N-channel pull-down, and serves to reduce the output node voltage to a level which does not present a likelihood of hot-electron effects in the main pull-down device. Thus, large current flow through the N-channel pull-down is delayed until the voltage is reduced to an acceptable level. At the same time, this delay is not such as would unduly compromise the high speed nature of the circuits.

Hot electron effects are largely limited to the state where the gate voltage is at the threshold voltage or slightly higher, and where there is a large drain-to-source voltage. Hot-electron effects are extremely sensitive to the drain-to-source voltage. For example, an N-channel device designed to operate at 2.5V as the supply voltage is seen to severely degrade as voltages of over 3V are imposed while the gate is slightly over the threshold voltage. In other cases P-channel devices may be sensitive to hot-electron degradation and need a similar solution.

In general, the method of reducing hot-electron degradation of the invention is to provide a faster-operating device in parallel with the output transistor to reduce the voltage across the output transistor prior to the transition of the gate into the problem region above the threshold. For example, many off-chip drivers have a compensation resistor in series between the predriver and the driver, used to slow down the transition to avoid undesirable inductive effects. A conventional stack of two N-channel transistors can be used as the parallel circuit, with the gate of the top transistor tied to the normal chip supply voltage and the gate of the bottom device tied to the predriver output prior to the compensation resistor. This arrangement will assure that the stack turns on before the large output device begins to turn on. The stack is sized to drop the output voltage enough to ensure the output device does not suffer hot-electron degradation.

Another method to provide this very fast but relatively small current preceding the initial turn on of the output device is to use a transistor of the opposite type in parallel with the large output device, e.g., a P-channel transistor in parallel with the output N-channel device. Since the driving phase needs to be different, the parallel P-channel device is driven by a signal taken prior to the last inverter in the predriver, so the signal which drives the large output N-channel device is delayed by the last inverter of the predriver; this delay ensures that the parallel transistor has time to reduce the output voltage prior to the hot-electron condition being reached by the output N-channel device.

The needed drop in output voltage is accomplished in one or more ways, assuming there is a small (but fast) parallel current established as just described. Sometimes an on-chip resistor is used between the drain of the output device and the chip pad, and in this case the current through the parallel device will cause an IR drop in this resistor. Even in the absence of this resistor, the circuit will see a voltage drop due to the "resistor divider" effect of the parallel circuit's impedance with the transmission line impedance of the driven line. Some manufacturing technologies may produce semiconductor diode structures or Schottky diode structures (due to materials used) that when forward biased by the parallel circuit's current will provide a reduction in voltage.

The compensation resistor mentioned above, connected between the predriver and the gate of the large N-channel output transistor, is a means of controlling the rate of change of the output current. This is needed to reduce noise in the ground and voltage supply buses. The parallel circuit, which must be very fast, has little or no compensation, but the current is relatively small (perhaps 20% of the output current) so its contribution is small enough so that excessive noise is not generated.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
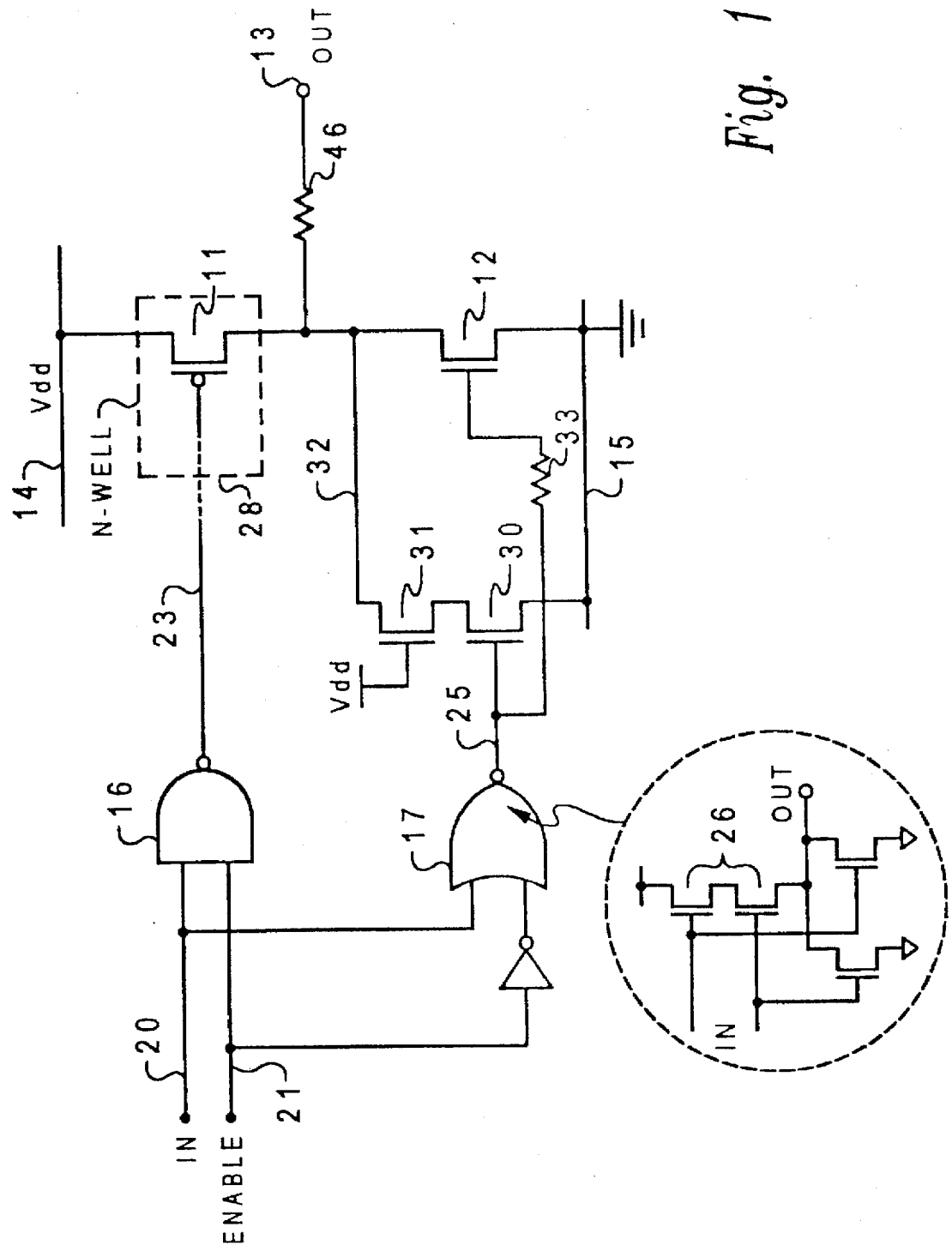
FIG. 1 is an electrical schematic diagram of an output driver circuit which is constructed using features of one embodiment of the present invention.

Referring to FIG. 1, a CMOS output driver circuit 10 is illustrated according to one embodiment of the invention. The circuit 10 is typically part of a microprocessor chip, a memory chip, or a special-purpose logic circuit. This circuit uses a pair of push-pull output transistors including a P-channel output driver transistor 11 and an N-channel output driver transistor 12, driving an output node 13 between the two. The output node 13 is usually a pad of the integrated circuit chip, connected to a high-performance bus external to the chip. Typically the chip in which the circuit 10 is constructed would use a supply voltage of 2.5V, with the buffer circuitry using 3.6V, while other chips driving the buses may use a 3.6V supply to drive the bus signals. There may be a large number of these outputs 13 for a microprocessor chip, driving several system buses, including 32-bit or 64-bit data buses, as well as address buses, for example. These buses may have other chips connected to them which use higher supply voltages, and also may have momentary over-voltages on them exceeding the supply voltages or normal logic-level voltages. The push-pull output driver transistors 11 and 12 are connected in series between a $V_{dd}$ line 14 and a $V_{ss}$ line 15, where the voltage supply represented by these lines 14 and 15 is perhaps 3.6-Volts. With a low voltage supply such as this, the possibility of overvoltage on the output pad 13 is significant, and the overvoltage could produce the long-term degradation caused by the hot-electron effect as discussed.

The output transistors 11 and 12 are typically driven by a predriver or control circuit including a NAND gate 16 and a NOR gate 17. These gates are constructed of any known, suitable predriver technology, and have as inputs a Data-In pin 20 and an Enable pin 21. The Enable pin is used to define when the output driver is enabled, and also to force a tristate condition on the driver output pad 13, and to shut off any DC current paths in the circuit. A tristate condition is one where both of the push-pull output transistors 11 and 12 are off so that the node 13 sees a very high impedance looking back into the output driver circuit. The Enable pin 21 and Enable function is typically used during normal circuit operation, and is not important here.

The function of the NAND gate 16 is to set up a condition where the gate node 23 for the P-channel pull-up transistor 11 is low, near $V_{ss}$, when the Data input pin 20 is high, turning on the P-channel device and producing a "1" level output on node 13, i.e., a level equal to the supply voltage $V_{dd}$ of line 14. Thus, if the Data In and Enable pins 20 and 21 are both high, the output of the gate 16 is high, and the gate 23 of the pull-up transistor will be high. Conversely, the gate node 23 for the P-channel pull-up transistor 11 is driven high, at or near $V_{dd}$, when the Data input pin 20 is low, turning off the P-channel device and producing a "0" level output on node 13, i.e., a ground or $V_{ss}$ level of line 15. Thus, if the Data In pin 20 is low, and the Enable pin 21 is high, the output of the gate 16 is low, and the gate 23 of the pull-up transistor will be low.

In like manner, the function of the NOR gate 17 is to set up a condition where the gate node 25 for the N-channel pull-down transistor 12 is high, near $V_{dd}$, when the Data input pin 20 is low, turning on this transistor 12 and producing a "0" level output on node 13. Thus, if the Enable pin 21 is high, the inverter 26 causes a "0" input to the NOR gate, so the Data In pin 20 will control the inverted NOR output on line 25. When Data input 20 is high, the NOR output is low, and the output node 13 is high, and vice versa.

The output of either one of the gates 16 or 17 is a CMOS inverter having a P-channel transistor 26 and an N-channel transistor 27, connected in series across the power supply, i.e., between $V_{dd}$ line 14 and $V_{ss}$ line 15. These outputs of the predrivers produce voltage transitions which may be too rapid to be compatible with low-noise requirements, and so compensation means such as series resistors are often used to drive the gates of the output pull-up and pull-down transistors, as mentioned above.

The P-channel pull-up transistor 11 is protected from voltage above $V_{dd}$ on the output node 13 by techniques as described in U.S. Pat. No. 5,151,619; the present invention is not concerned with that type of overvoltage protection. The circuit thus far described is conventional, and is illustrated here merely as background and context.

According to one embodiment of the invention, the off-chip driver circuit of FIG. 1 includes a second N-channel transistor 30 in series with a stacked N-channel transistor 31 is used to relieve the excess voltage on the output node 32 when the output node is high and being driven to zero by turning on the pull-down transistor 12. The gate of the stacked transistor 31 is connected to $V_{dd}$, just as in a conventional stacked arrangement, so this device is immune to hot electron effects, and this transistor 30 functions to supply about 20% of the drive current to pull down the node 13. The main pull-down transistor 12 supplies the remaining 80%. Since the transistors 30 and 31 do not conduct the bulk of the pull-down current, they can be much smaller than the transistor 12, and so the problem of using too much area by stacking the N-channel pull-down devices is alleviated, while the hot-electron immunity is still provided. The turn-on of the main pull-down device is delayed slightly by an RC delay made up of a compensation resistor 33, which may be 1K $\Omega$ in one example, and the parasitic capacitance of the gate of the transistor. Because of this delay (normally present as compensation to avoid noise), the pull-down device 12 does not turn on until the parallel path, transistors 30 and 31, have reduced the voltage on node 13.

Figure 2:
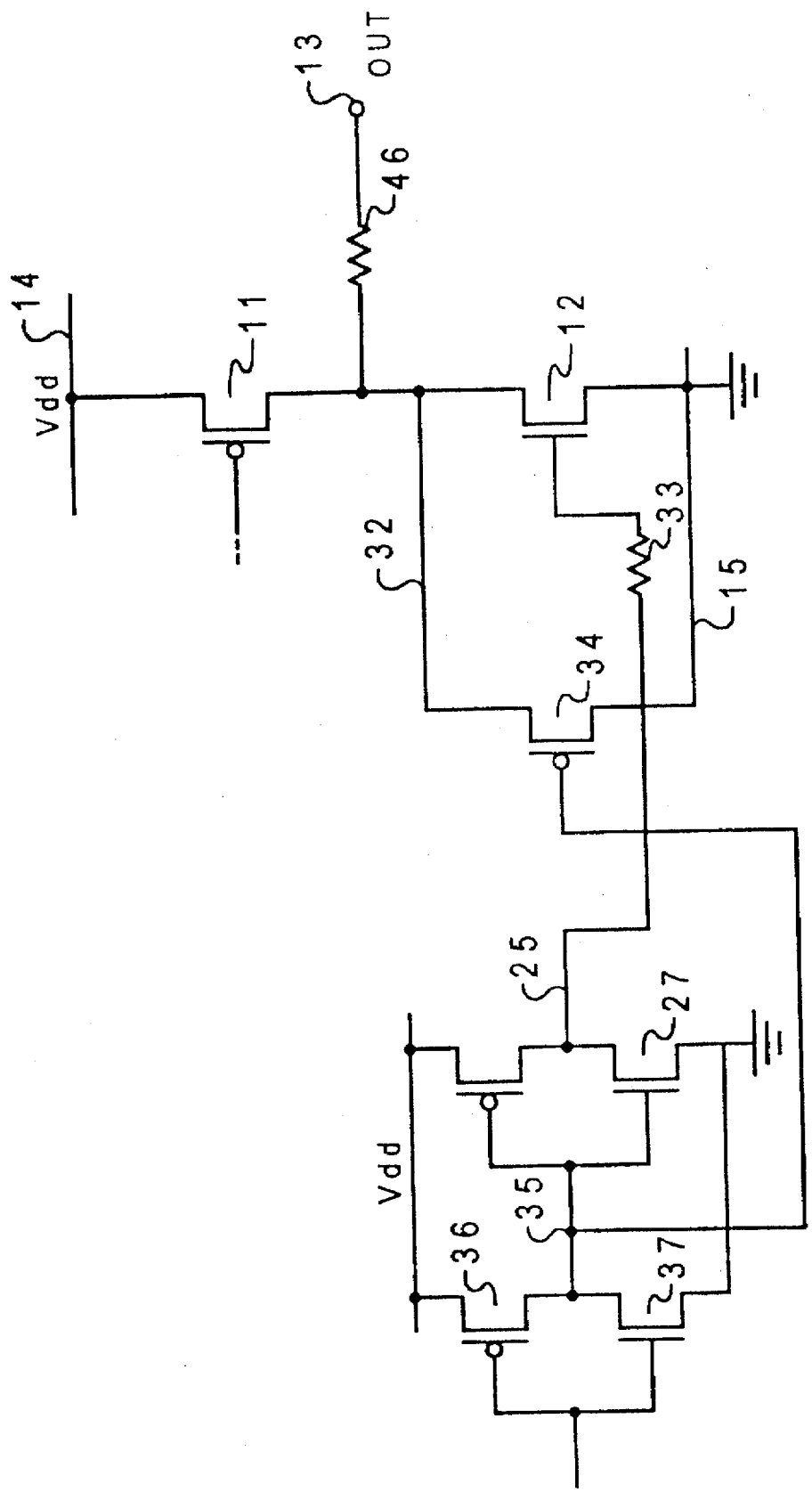
FIG. 2 is an electrical schematic diagram of a part of an output driver circuit like FIG. 1 according to another embodiment of the invention.

Referring to FIG. 2, another embodiment of the invention is shown using a P-channel transistor 34, in place of the transistors 30 and 31, to reduce the voltage on the node 32 when this node is being pulled down. The P-channel transistor 34 has its gate driven from a different phase, compared to the drive for N-channel transistor 12, so, to this end, the gate is connected to a node 35, the output of a previous inverter stage in the predriver, made up of P-channel transistor 36 and N-channel transistor 37. Being driven by an earlier inverter also functions to provide the needed time shift, rather than relying only on the RC delay due to the compensating resistor 33.

Figure 3:
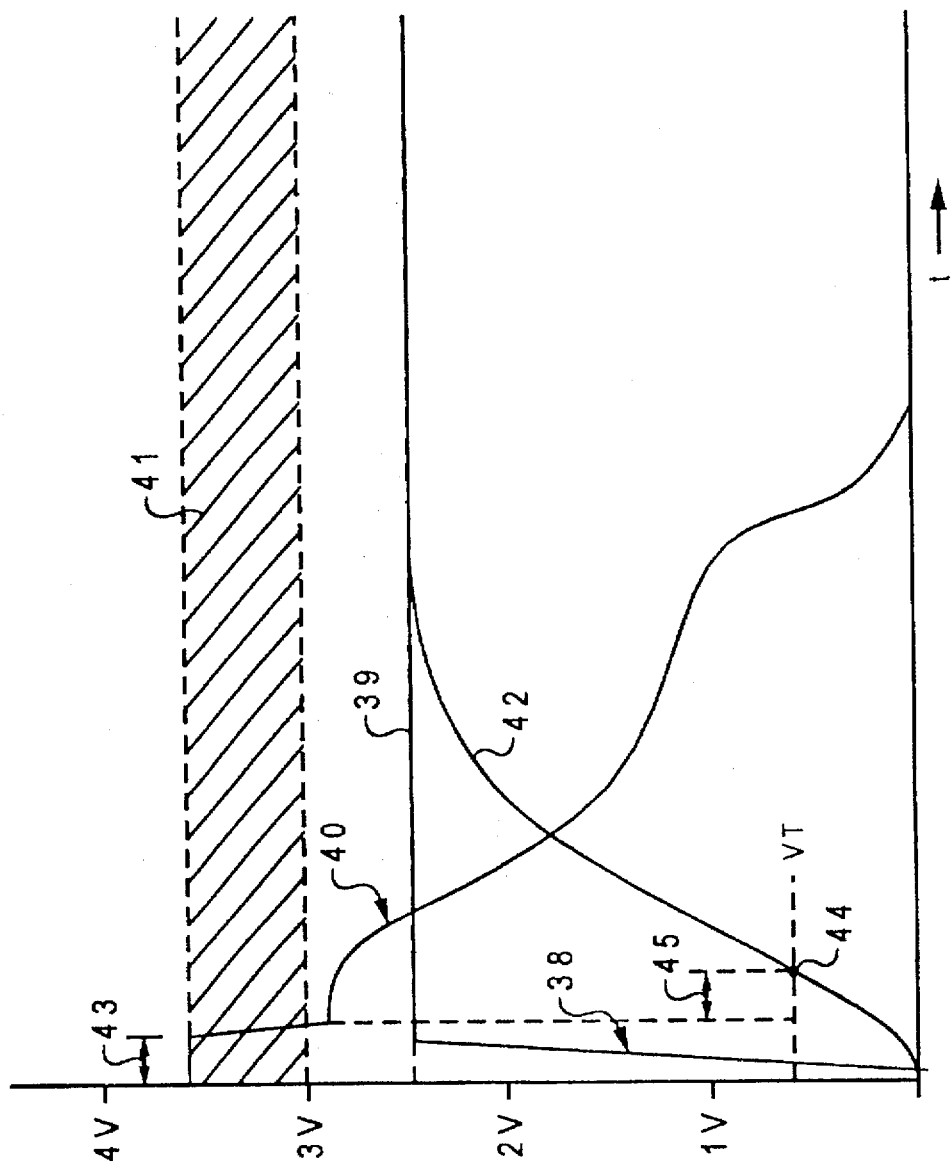
FIG. 3 is a timing diagram showing voltage vs. time for waveforms in the circuit of FIG. 1.

In FIG. 3, a timing diagram is shown to illustrate voltage vs. time waveforms in the circuit of FIGS. 1 and 2 for a 2.5V chip interfacing with a 3.6V chip. The voltage at the output of the predriver 17, on node 25, is represented by a line 38, and this voltage is seen to be sharply rising to the level 39 of the internal supply voltage $V_{dd}$, in this case 2.5V. The voltage across the protected output transistor 12, on node 32, is represented by a line 40, which starts at a level of about 3.5V in this example. The voltage of concern for possible hot-electron degradation is represented by the hatched area 41. The voltage on the gate of the protected N-channel pull-down transistor 12 is shown by a line 42, which rises much more slowly than the predriver output line 38. When the predriver output turns on the parallel device 30 (or 34), the output node voltage 40 immediately drops to a level below the danger region 41, during time 43, then as the threshold voltage of the pull-down transistor 12 is reached at point 44, the output node 13 continues to drop to zero. The time interval 45 must be positive, i.e., the voltage 40 must be under 3V before the voltage 42 gets to the threshold $V_t$.

The drop in output voltage on node 32 during the period 43 necessary to reduce hot-electron degradation in the pull-down transistor 12 is accomplished in one or more ways, assuming there is a small (but fast) parallel current established through the transistor 30 and 31 of FIG. 1 or through transistor 34 of FIG. 2 as described above. It is often the case that an on-chip resistor 46 is added between the drain of the output device and the chip pad to match transmission line impedance and reduce shoot-through currents. It is important to match transmission line impedance (normally the output driver circuit drives 50-to 70-ohm lines). Many I/C manufacturing technologies provide better impedance control (more linear and with tighter tolerance) for resistor elements than with MOS transistors. Thus the MOS transistor is designed with lower impedance (may be one-third) than the transmission line, with the remainder coming from a resistive element such as the resistor 46. Typically, instead of a single resistor 46 of, say, 30-ohms as seen in the Figure, there would be separate 30-ohm resistors, one between the drain of the pull-up device 11 and the output node 13 and another between the output node 13 and the drain of the pull-down transistor 12; the reason this is done is to reduce "shoot-through" currents that may occur when the driver's logic state toggles—although this is normally minimized, there are times when the two series resistors are required. In either case, the current through the parallel device will cause an IR drop in the resistor 46 or other series resistor as may be used. Even in the absence of the resistor 46, the circuit of FIGS. 1 or 2 will see a voltage drop due to "resistor divider" effect of the impedance of the parallel circuit with the transmission line impedance of the driven line connected to the node 13.

Figure 4:
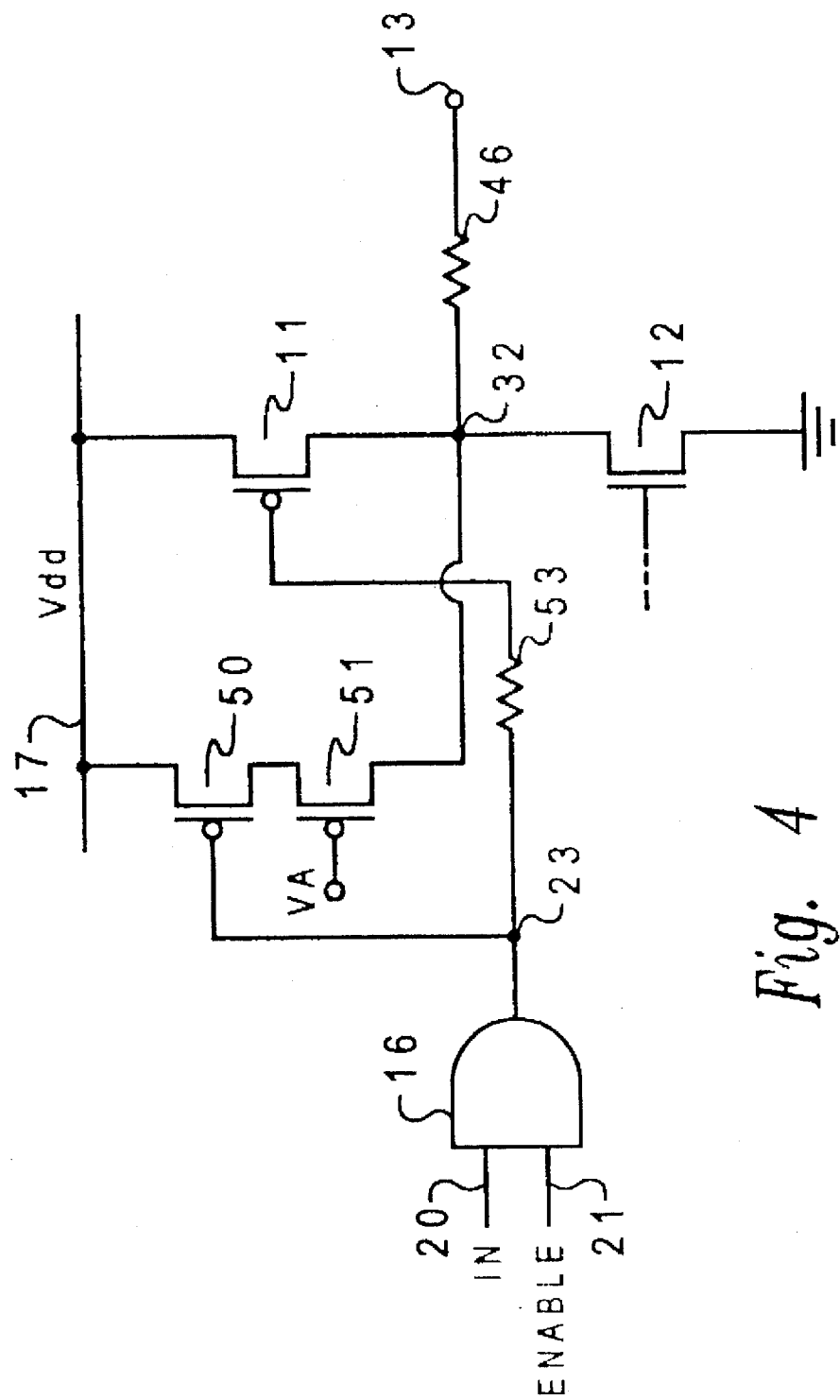
FIG. 4 is an electrical schematic diagram of an output driver circuit which is constructed using features of another embodiment of the invention.

In the discussion thus far, an arrangement for protecting the pull-down device 12 is described. The same method can be used for hot-electron protection of the pull-up device 11. Referring to FIG. 4, a pair of P-channel transistors 50 and 51 are connected in series across the source-to-drain path of the transistor 11, functioning in the same manner as the transistors 30 and 31 of FIG. 1. The gate of the transistor 50 is connected to the node 23, and turns on this transistor faster than the same input voltage turns on the transistor 11 due to the delay caused by the compensator resistor 53 (corresponding to the resistor 33). The voltage $V_A$ may be ground or it may be slightly (one or two diode drops) above ground.

Figure 5:
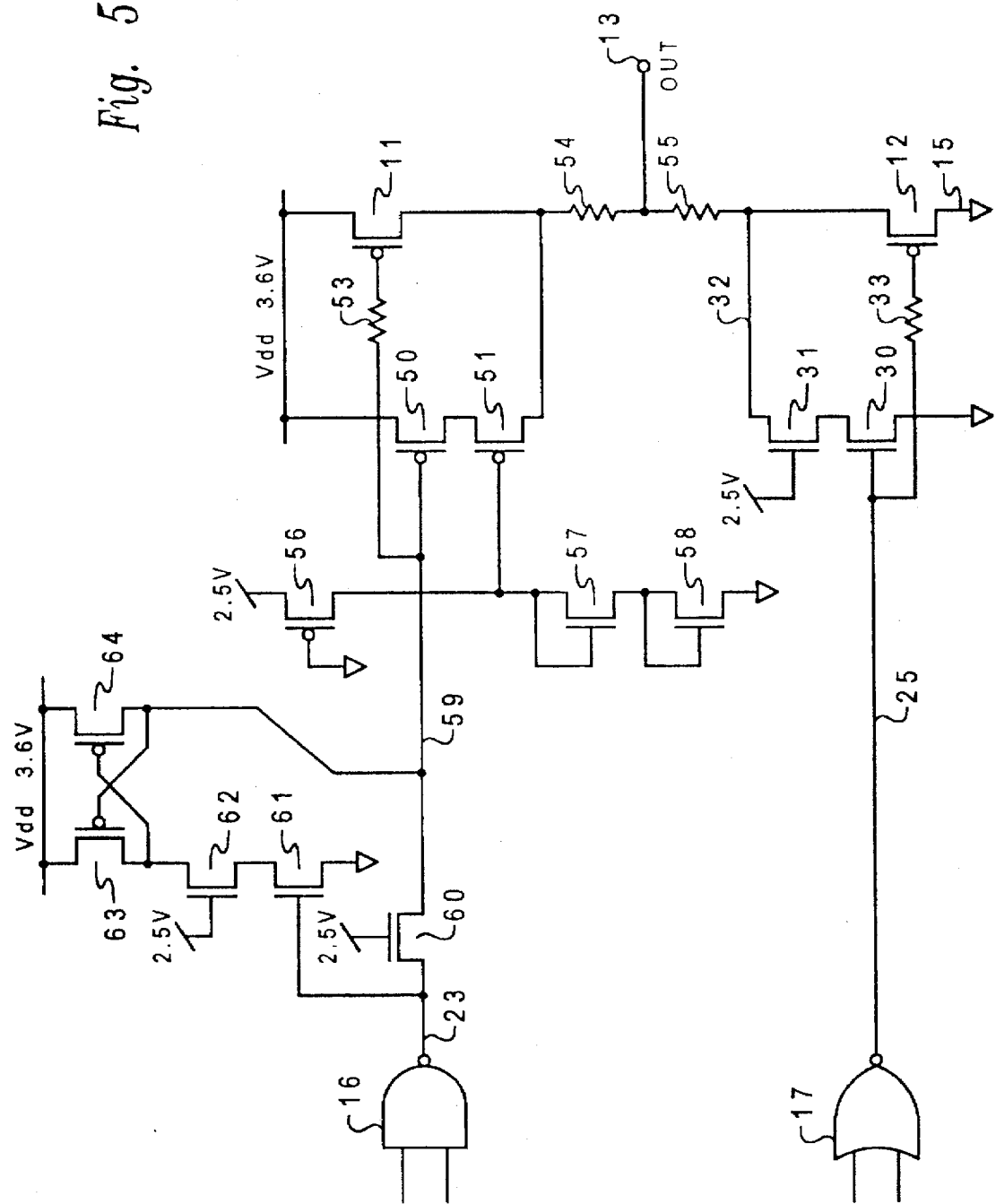
FIG. 5 is an electrical schematic diagram of an output driver circuit like FIG. 1 according to still another embodiment of the invention.

Referring to FIG. 5, a buffer circuit is shown for interfacing between a 2.5V chip and a 3.6V chip. This circuit uses two supply voltages, a 3.6V supply for the push-pull output transistors 11 and 12, and a 2.5V supply for the main parts of the circuit up to the predrivers 16 and 17. The circuit has shunt transistors 30 and 31 for N-channel pull-down transistor 11 as in FIG. 1, and shunt transistors 50 and 51 for the pull-up transistor 11 as in FIG. 4, to reduce hot-electron degradation. Two series resistors 54 and 55 are used in place of the resistor 46, for line impedance matching and shoot-through current reduction, as discussed above. The transistor 31 has 2.5V applied to its gate. The transistor 51 has a bias applied to its gate from a divider made up of transistors 56, 57, and 58 which have a 2.5V supply; these devices bias the gate of the transistor 51 without introducing a damaging gate-to-source or gate-to-drain voltage. The node 59 at the gate of the pull-up transistor 11 is driven to 3.6V when the node 23 is driven to 2.5V, by the use of the transistors 60, 61, 62, 63, and 64. Node 59 is boosted by this circuit without stressing the devices in the gate 16.

Figure 6:
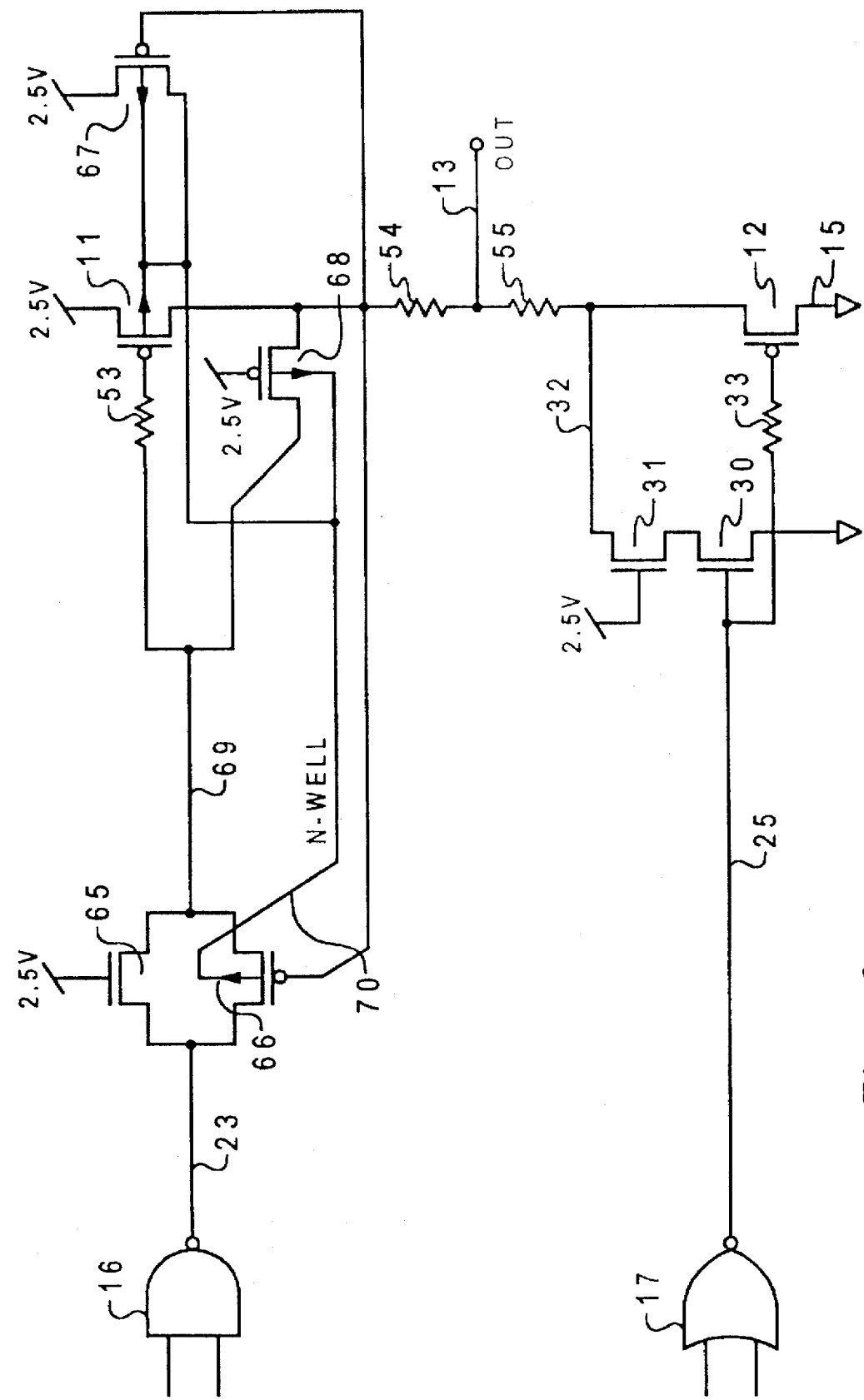
FIG. 6 is an electrical schematic diagram of an output driver circuit like FIG. 1 according to a further embodiment of the invention.

Referring now to FIG. 6, a buffer circuit is shown for a 2.5V chip interfacing to a 3.6V chip, using drive levels of 2.5V-to-ground. The hot-electron protection circuit for the pull-down transistor 12, using the shunt transistors 30 and 31, is the same as in FIG. 1 and 5. The pull-up transistor 11 does not need hot-electron overvoltage protection because its gate-to-source, gate-to-drain, and gate-to-N-Well voltages do not exceed 2.5V. The transistors 65, 66, 67, and 68 form a conventional overvoltage protection arrangement as described in U.S. Pat. No. 5,151,619 set forth above. Transistors 65 and 66 form a transfer gate to allow a node 69 to follow the node 13 up to voltages above the normal $V_{dd}$ by conduction through the transistor 68, but yet keep this voltage on node 69 from the node 23. The transistors 66, 67, and 68 are all three in a common N-well 70 which is floating, connected to $V_{dd}$ through the transistor 67 when the node 13 is low, then isolated from $V_{dd}$ (floating) when the output is high.

While the invention has been particularly shown and described with reference to a preferred embodiment, it will be understood by those skilled in the art that various changes in form and detail may be made therein without departing from the spirit and scope of the invention.

What is claimed is:

1. An output driver circuit, comprising:

an output transistor having a source-to-drain path connected between an output node and a terminal of a power supply;

a parallel transistor circuit, including a P-channel transistor, for shunting said source-to-drain path of said output transistor and having an impedance greater than that of said source-to-drain path;

a predriver circuit having first and second outputs, the first output connected to a gate of said output transistor, and the second output connected to a gate of said P-channel transistor the first output being driven to a turn-on level after the second output.

2. An output driver circuit according to claim 1 wherein said output transistor is an N-channel pull-down device and said terminal is a ground terminal wherein N-channel pull-down device is coupled directly to said ground terminal.

3. An output driver circuit according to claim 1 wherein a compensating resistor is connected in series between said first output of said predriver and only said gate of said output transistor.

4. A method of operating an output driver circuit of the type having an output transistor with a source-to-drain path connected between an output node and a terminal of a power supply, comprising the steps of:

generating a drive voltage to produce a transition of said output node from one level to another level;

shunting a small current through a transistor path parallel to said source-to-drain path which includes a P-channel transistor in response to said drive voltage; and thereafter applying said drive voltage to a gate of said P-channel transistor.

5. A method of operating an output driver circuit according to claim 4, wherein said output transistor is an N-channel pull-down device and said terminal is a ground terminal.

6. A method of operating an output driver circuit according to claim 4 including the step of delaying said step of applying said drive voltage by a compensating resistor in series between an output of a predriver and only said gate of said output transistor.

* * * * *